(12) United States Patent
Carroll

(10) Patent No.: US 7,369,217 B2
(45) Date of Patent: May 6, 2008

(54) METHOD AND DEVICE FOR IMMERSION LITHOGRAPHY

(75) Inventor: Allen Carroll, Stockholm (SE)

(73) Assignee: Micronic Laser Systems AB, Taby (SE)

( * ) Notice: Subject to any disclaimer, the term of this patent is extended or adjusted under 35 U.S.C. 154(b) by 416 days.

(21) Appl. No.: 10/679,701

(22) Filed: Oct. 3, 2003

(65) Prior Publication Data

US 2005/0073670 A1    Apr. 7, 2005

(51) Int. Cl.
*G03B 27/52*    (2006.01)

(52) U.S. Cl. .............................. 355/77; 355/18; 355/53; 430/322

(58) Field of Classification Search ....................... None
See application file for complete search history.

(56) References Cited

U.S. PATENT DOCUMENTS

| | | | |
|---|---|---|---|
| 4,480,910 | A | 11/1984 | Takanashi et al. |
| 5,900,354 | A | 5/1999 | Batchelder |
| 6,230,722 | B1 | 5/2001 | Mitsumori et al. |
| 6,952,253 | B2 | 10/2005 | Lof et al. |
| 6,954,256 | B2 | 10/2005 | Flagello et al. |
| 2003/0030916 | A1 | 2/2003 | Suenaga |
| 2003/0123040 | A1* | 7/2003 | Almogy ........................ 355/69 |
| 2004/0075895 | A1* | 4/2004 | Lin ............................. 359/380 |
| 2006/0023182 | A1* | 2/2006 | Novak et al. .................. 355/53 |

FOREIGN PATENT DOCUMENTS

| | | |
|---|---|---|
| EP | 1498778 A1 | 1/2005 |
| JP | 10255319 A | 9/1998 |
| WO | WO 9949504 A1 | 9/1999 |

OTHER PUBLICATIONS

PCT International Search Report re: International Application No. PCT/SE2004/001403 (filed Oct. 1, 2004) mailed Mar. 8, 2005 (not prior art).
PCT International Preliminary Report on Patentability for Application No. PCT/SE2004/001403, completed Jan. 17, 2006.

* cited by examiner

*Primary Examiner*—Mark F. Huff
*Assistant Examiner*—Daborah Chacko-Davis
(74) *Attorney, Agent, or Firm*—Ernest J. Beffel, Jr.; Haynes Beffel & Wolfeld LLP

(57) ABSTRACT

The present invention relates to an immersion lithographic system for patterning a work piece arranged at an image plane and covered at least partly with a layer sensitive to electromagnetic radiation. Said system comprising a source emitting electromagnetic radiation onto an object plane, a mask, adapted to receive and modulate said electromagnetic radiation at said object plane and to relay said electromagnetic radiation toward said work piece, and an immersion medium contacting at least a portion of a final lens of said lithographic system and a portion of said work piece, wherein an area of said contacting is restricted by capillary forces. The invention further relates to a method for patterning a workpiece.

31 Claims, 3 Drawing Sheets

METHOD AND DEVICE FOR IMMERSION LITHOGRAPHY

TECHNICAL FIELD

The present invention relates in general to techniques for optical lithography, and in particular to a method for patterning a workpiece using immersion lithography.

DESCRIPTION OF THE BACKGROUND ART

When making a pattern on a workpiece, which workpiece could be integrated circuits, masks, reticles, flat panel displays, micro mechanical or micro optical devices and packaging devices, e.g. lead frames and MCM's, a pattern may be exposed in a positive photo resist. In case of producing a mask, the resist in the exposed areas is removed by a develop-and-etch process and, unprotected chromium is then dissolved by a chromium etchant. The result, a glass plate with a pattern in opaque chromium, is used as an optical contact or projection mask for production of a device layer pattern in flat panel displays or integrated circuits.

The pattern generator could be any one of the types of commercially available laser pattern generators using acousto-optical modulators, rotating mirrors and electro-optic shutters, or spatial light modulators for producing said pattern. That is, the light may be scanned or imaged onto the workpiece.

Mask making for the 70 nm semiconductor technology node and below is expected to be accomplished by using either electron beam tools or optical mask makers, which employ light with wavelengths shorter than 248 nm. Optical mask making tools typically use excimer lasers as their light source, and are therefore restricted in the wavelengths they can use. Krypton fluoride excimer lasers produce light at 248 nm, and the next shorter wavelength available is 193 nm, produced by argon fluoride lasers. Adapting optical mask makers to use 193 nm is quite difficult for several reasons: (1) the choice of optical materials is restricted, because most optical material absorb 193 nm light. Only fused silica and calcium fluoride are commonly used. Optical coatings also present challenges. (2) 193 nm light is absorbed by oxygen in the air, with the accompanying production of ozone, so an optical path must be sealed and purged of oxygen. This makes the opto-mechanical design more cumbersome, and makes alignment and measurement quite difficult. (3) 193 nm lasers are not as reliable or stable as 248 nm lasers, and their energy output is not as large as 248 nm lasers, so obtaining and controlling the needed exposure energy becomes problematic. (4) 193 nm photons are very energetic, and tend to cause deterioration of materials they strike.

A suitably designed system using immersion optics operating at 248 nm is almost certainly capable of achieving lithographic specifications suitable for said 70 nm semiconductor technology node, and for the reasons stated above, this may present an easier technological challenge than development of a tool employing shorter wavelengths.

SUMMARY OF THE INVENTION

In view of the foregoing background, as the lithographic features required on semiconductor masks get smaller, the demands on the precision and resolution of mask making equipment or direct write equipment increase.

Accordingly, it is an object of the present invention to provide a method for patterning a work piece using immersion lithography, which overcomes or at least reduces the above mentioned problem.

In one embodiment, the invention provides an immersion lithographic system for patterning a work piece arranged at an image plane and covered at least partly with a layer sensitive to electromagnetic radiation. Said lithography system comprising a source emitting electromagnetic radiation onto an object plane, a modulator adapted to receive and modulate said electromagnetic radiation at said object plane in accordance to an input pattern description and to relay said electromagnetic radiation toward said work piece, an immersion medium contacting at least a portion of a objective lens of said lithographic system and a portion of said work piece, wherein an area of said contacting is restricted by capillary forces. Other aspects of the present invention are reflected in the detailed description, figures and claims.

BRIEF DESCRIPTION OF THE DRAWINGS

For a more complete understanding of the present invention, and the advantages thereof, reference is now made to the following description taken in conjunction with the accompanying drawings, in which:

FIG. 2b depicts an exaggerated view of the encircled area in FIG. 2a.

DETAILED DESCRIPTION OF THE PREFFERED EMBODIMENTS

Figure 1:
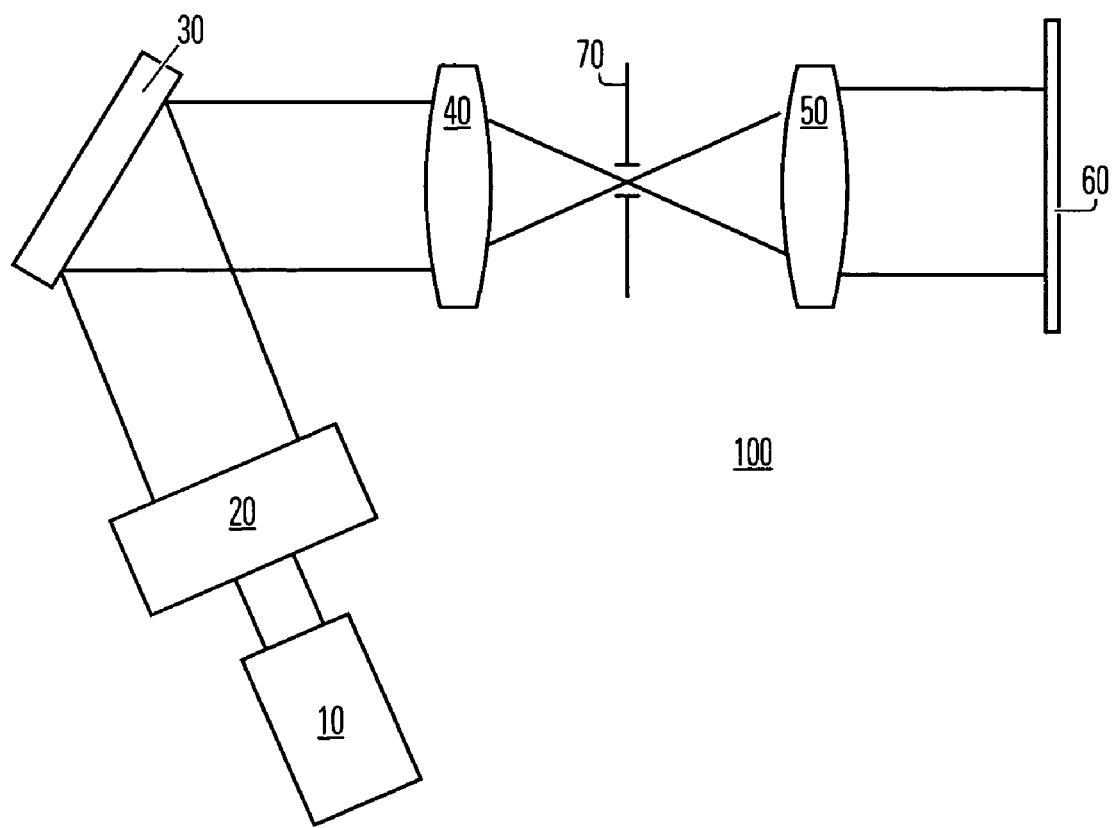
FIG. 1 illustrates a schematic view of an embodiment of a pattern generator according to prior art.

FIG. 1 illustrates an embodiment of an apparatus 100 for patterning a work piece 60 according to prior art, into which the present invention could easily be inserted.

Said apparatus 100 comprising a source 10 for emitting electromagnetic radiation, an objective lens arrangement 50, a computer-controlled reticle 30, a beam conditioning arrangement 20, a spatial filter 70 in a fourier plane, a Fourier lens arrangement 40 and said work piece 60.

The source 10 may emit radiation in the range of wavelengths from infrared (IR), which is defined as 780 nm up to about 20 µm, to extreme ultraviolet (EUV), which in this application is defined as the range from 100 nm and down as far as the radiation is possible to be treated as electromagnetic radiation, i.e. reflected and focused by optical components. The source 10 emits radiation either pulsed or continuously. The emitted radiation from the continuous radiation source 10 can be formed into a pulsed radiation by means of a shutter located in the radiation path between said radiation source 10 and said computer-controlled reticle 30. For example, the radiation source may be a KrF excimer laser with a pulsed output at 248 nm, a pulse length of approximately 10 ns and a repetition rate of 1000 Hz. The repetition rate may be below or above 1000 Hz.

The beam conditioning arrangement 20 may be a simple lens or an assembly of lenses. The beam conditioning arrangement 20 distributes the radiation emitted from the radiation source 10 uniformly over a surface of the computer-controlled reticle 30. In case of a continuous radiation source a beam of such a source may be scanned over the surface of the computer-controlled reticle.

Workpiece 60 is moved in a systematic fashion so that the optical system synthesizes the desired device layer pattern.

The computer-controlled reticle 30 may be a Spatial Light Modulator (SLM). In this embodiment the SLM comprises all information at a single moment that is required to pattern a certain area of the workpiece 60.

For the remainder of this application an electrostatically controlled micro mirror matrix (one- or two dimensional) is assumed, although other arrangements as described above are possible, such as transmissive or reflective SLMs relying on LCD crystals or electrooptical materials as their modulation mechanism, or micromechanical SLMs using piezoelectric or electrostrictive actuation.

The SLM 30 is a programmable device that produces an output radiation beam that is modulated by separate inputs from a computer. The SLM 30 simulates the function of a mask through the generation of bright and dark pixels in response to computer fed data. For example the phase SLM 30 is an array of etched solid state mirrors. Each micromirror element is suspended above a silicon substrate by restoring hinges, which may be supported either by separate support posts or by the adjacent mirrors. Beneath the micromirror element are address electrodes. One micromirror represents one pixel in the object plane. The pixel in the image plane is here defined as to have the same geometry as the micromirror but the size may be different due to the optics, i.e. larger or smaller depending on whether the optics is magnifying or demagnifying.

The micromirror and the address electrodes act as a capacitor so that for example a negative voltage applied to the micromirror, along with a positive voltage to the address electrode, will twist the torsion hinges suspending the micromirror which in turn allow the micromirror to rotate or to move up or down, thereby creating a phase modulation of the reflected light.

A projection system comprises in this embodiment the Fourier lens arrangement 40, which may be a compounded tube lens, the spatial filter 70 and the objective lens arrangement 50. The Fourier lens arrangement 40 and the spatial filter 70 form together what is generally called a Fourier filter. The Fourier lens arrangement 40 projects the diffraction pattern onto the spatial filter 70. The objective lens arrangement 50, which may be a compounded final lens, forms the aerial image on the work piece 60.

The spatial filter 70 is in this embodiment an aperture in a plate. Said aperture being sized and positioned so as to block out essentially all light which is diffracted into the first and higher diffraction orders, for example said aperture may be located at the focal distance from the Fourier lens arrangement 40. The reflected radiation is collected by said Fourier lens arrangement 40 in the focal plane, which acts at the same time as a pupil plane of the objective lens arrangement 50. The aperture cuts out the light from the first and higher diffraction orders of the addressed micromirrors in the SLM, while the radiation from the non-addressed mirror surfaces can pass the aperture. The result is an intensity modulated aerial image on the work piece 60 as in conventional lithography.

Figure 2A:
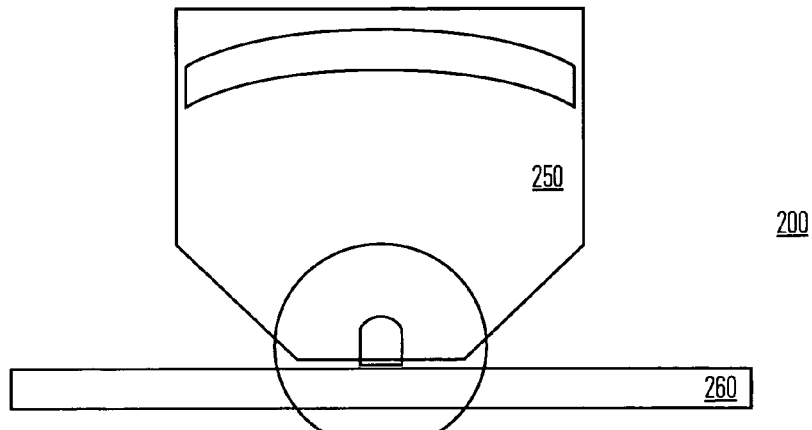
FIG. 2a depicts an embodiment of immersion optics according to the present invention.
Figure 2B:
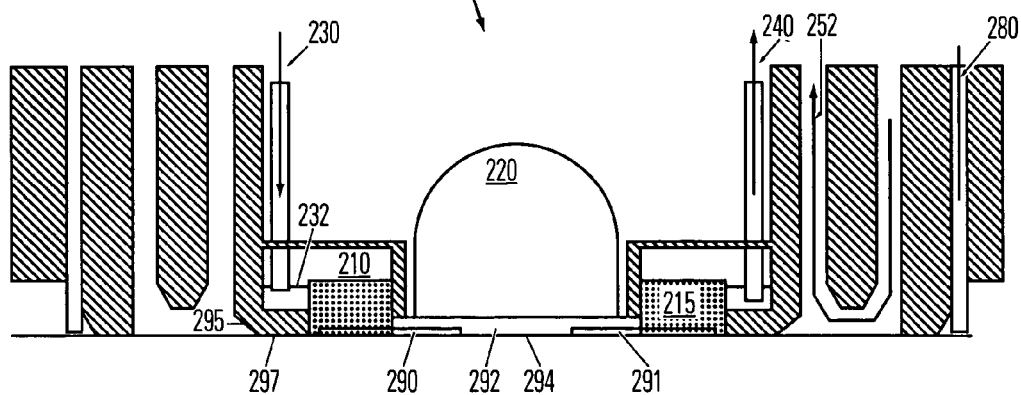

FIG. 2a illustrates immersion optics 200 according to one embodiment of the present invention. An exaggerated view is illustrated in FIG. 2b of the encircled area in FIG. 2a. In FIG. 2a, a workpiece is denoted 260 and an objective lens denoted 250. The objective lens 50 in FIG. 1 is separated from the workpiece by air or any other gaseous medium. In FIGS. 2a and 2b the objective lens 250 is in contact with the workpiece 260 via an immersion medium, normally a liquid.

In the exaggerated view in FIG. 2b the details of the objective lens 250 and its surrounding elements are denoted as follows, an immersion fluid supply tube 230, an immersion fluid reservoir 210, a last element of the objective lens 220, dispenser grooves 290, 291, replaceable flat cover glass 292, immersion fluid film 294, a porous element 215, immersion fluid level 232, fluid removal tube 240, drying air 252, focus air 280, and the workpiece 260.

The immersion fluid may be any fluid, which will not react adversely with a photolithographic resist on the work piece, i.e., dissolve the resist or contaminate the same, is sufficiently transparent to the radiation in use, has an index of refraction such as to permit improved resolution imaging onto the resist etc. An example of such fluid is purified water.

Immersion fluid is supplied to the immersion fluid reservoir 210 via immersion fluid supply tube 230. The immersion fluid level 232 in the first immersion fluid reservoir 210 is kept on a level such that the porous or fibrous material 215 is partially saturated with said immersion fluid, here said partial saturation is indicated by a immersion fluid level 232 that is below a highest point of the porous material 215.

The immersion fluid is removed away from the fluid reservoir 210 via the immersion fluid removal pipe 240. Said fluid reservoir may be connectable to said porous material.

The porous material can be said to have several properties and functionality.

Firstly, said porous material may prohibit or substantially reduce said immersion liquid to comprise air or gaseous bubbles. Air or gaseous bubbles will cause undesired optical phenomena on the workpiece.

Secondly, when the immersion optics 200 will reach an edge of the workpiece to be patterned there will be no spill of immersion fluid since the porous material will suck up said immersion fluid from the surface. This is possible since said porous material is not completely saturated with said immersion liquid.

The distance from the last element of the final lens and the work piece is kept at a constant level by an air gage and a servo control (not shown). Focus air 280 is supplied into the substrate via at least one orifice 282 and for instance a hot wire will refer its temperature to another hot wire. Said another hot wire is set up to the desired conditions and any deviations between the two may be adjusted by lowering or increasing the focus air supply. Other air gage mechanism will be obvious for one skilled in the art and therefore needs no further explanation here.

Drying air 252 may be optionally supplied to the workpiece in order to eliminate any immersion fluid film remaining on the moving workpiece, which may affect the measuring of the distance via said air gage. Therefore said drying air is supplied to the wafer before the focus air, i.e., in between the immersion fluid film and the focus air.

Dispenser grooves 290, 291 are optionally arranged in the immersion optics 200. Said dispenser grooves have the property of supplying said immersion medium to a homogenous film between the objective lens and said workpiece more efficiently than without said grooves.

Said porous material may be a ceramic material, a wick or fibrous material, any suitable sintered material or an artificially manufactured honeycomb structure. It is also possible to use a solid material in which a plurality of holes are made. A dimension of said holes are adapted to exhibit a desired capillary action.

The objective lens may optionally be covered with said replaceable flat cover glass 292. Said glass will prevent said objective lens from any damage while scanning the objective lens over the workpiece 260.

The distance between the objective lens and the work piece may be between 200 nm to 1 mm.

In another embodiment said porous material 215 is omitted. Immersion medium is then supplied via at least one orifice to the gap between said immersion optics 200 and said work piece 260. The immersion is likewise removed through at least one orifice connectable to said immersion fluid reservoir and said immersion fluid removal tube.

The supply of immersion medium maintains the lateral dimension and homogeneity of the immersion film between the immersion optics and the work piece.

In the embodiment illustrated in FIG. 2b the immersion medium film is cut at the curved surface 295. At this curved surface the capillary action is gradually reduced, and the immersion medium will stop to expand when a certain distance between the immersion optics 200 and the work piece 260 is reached. This design efficiently keeps control of the lateral extension of the immersion medium film.

Figure 3:
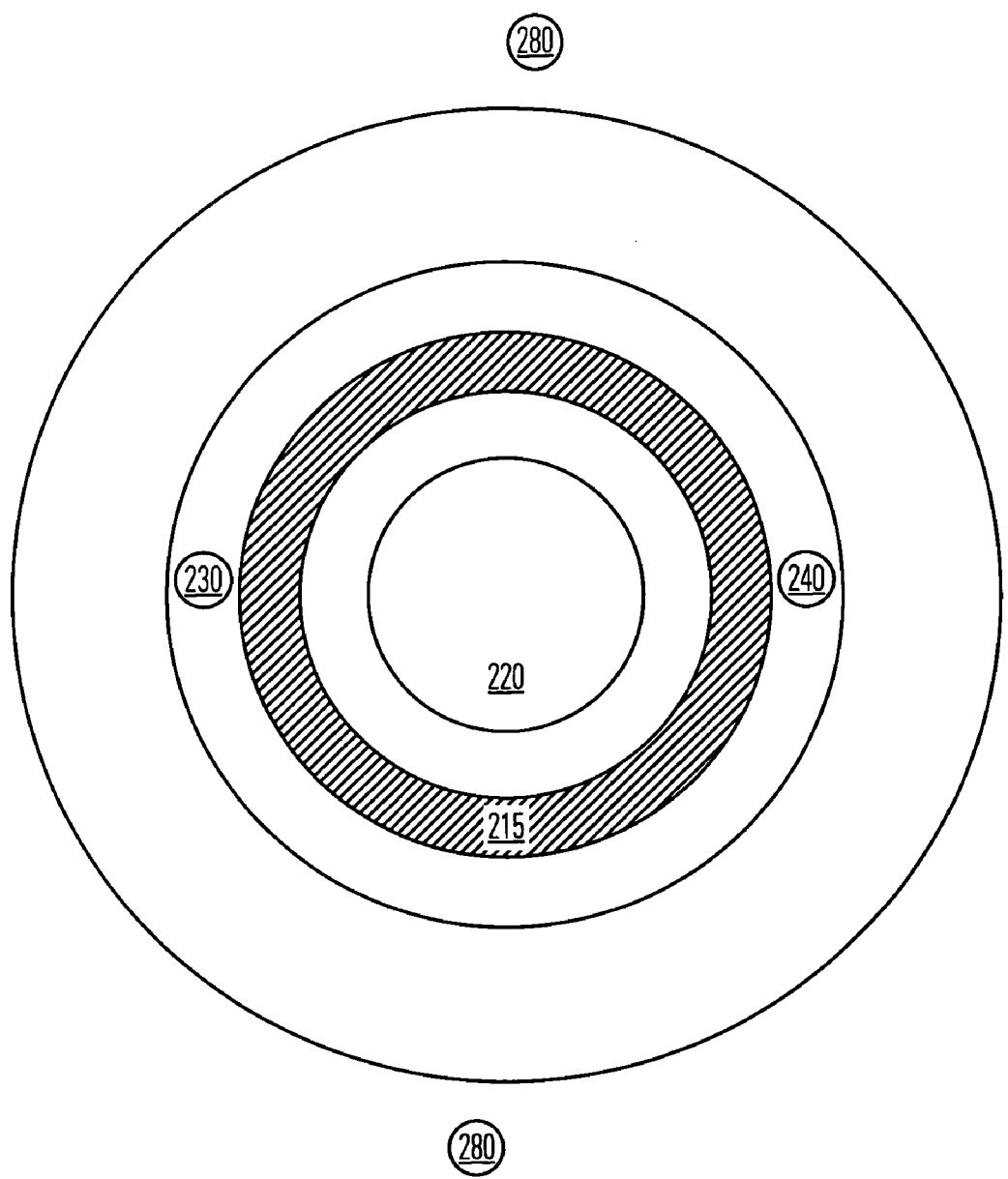
FIG. 3 depicts a plan view of the immersion optics in FIG. 2b.

The immersion fluid or medium supply makes sure that there is always enough immersion fluid to use. When the work piece is scanned in a lithographic process there is always some loss of immersion medium due to adhesion to the surface of the workpiece and/or evaporation. After a certain time there will be too little immersion medium for creating a homogenous film. At such time air bubbles may be created and the lithographic imaging process will be destroyed. Or, insufficient exchange of immersion medium may allow contaminants produced during exposure to accumulate and alter the properties of the immersion film FIG. 3 illustrates a plan view of the immersion optics 200 in FIG. 2a. The last (lowest) element 220 of the objective lens 250 is located in the middle of the immersion optics 200. The porous material 215 is surrounding said objective lens element. The immersion medium is supplied through the immersion medium supply tube 230 and removed from the immersion medium removal tube 240. Focus air 280 is used to keep control of the distance between the work piece and the objective lens.

In another embodiment at least a portion of the surface of said immersion optics, which is in contact with said immersion medium, has the property of wetting said surface, which in case of using water is denoted by hydrophilic properties. The workpiece, or more correctly the surface of the resist layer has non-wetting properties, which in the case of using water is denoted hydrophobic properties. This arrangement will make sure that there the immersion objective is always in contact with said immersion medium. The hydrophobic properties of the resist may reduce the immersion medium loss during scanning.

Thus, although there has been disclosed to this point a particular embodiment of the apparatus for patterning a work piece, it is not intended that such specific reference be considered as limitations upon the scope of this invention except in-so-far as set forth in the following claims.

For instance instead of using at least one spatial light modulator for generating the desired pattern to be printed on said work piece, acoustooptical devices (modulators and deflectors) may be used for the same purpose. Such devices are used in commercially available laser scanners for use in laser lithography, for instance Micronic's own Omega machines. Another pattern generator which uses acousto optical modulators and a rotating prism is Applied materials Alta machines. It is also possible to use a mask or a reticle for generating the pattern, i.e., a stepper.

Furthermore, having described the invention in connection with certain specific embodiment thereof, it is to be understood that further modifications may suggest themselves to those skilled in the art, it is intended to cover all such modifications as fall within the scope of the appended claims.

The invention claimed is:

1. An immersion lithographic system for patterning a work piece arranged at an image plane and covered at least partly with a layer sensitive to electromagnetic radiation, comprising:
   a source emitting electromagnetic radiation onto an object plane,
   a modulator, adapted to receive and modulate said electromagnetic radiation at said object plane in accordance to an input pattern description, and to relay said electromagnetic radiation toward said work piece,
   an immersion medium contacting at least a portion of an immersion optics of said lithographic system and a portion of said work piece, wherein said immersion medium is supplied through at least one orifice arranged in said immersion optic,
   a porous or fibrous material through which said immersion medium is supplied.

2. The apparatus according to claim 1, wherein said modulator is an SLM.

3. The apparatus according to claim 2, wherein said SLM comprises reflective pixels.

4. The apparatus according to claim 3, wherein said reflective pixels are micromirrors.

5. The apparatus according to claim 1, wherein said modulator is an acoustooptical modulator.

6. The apparatus according to claim 1, wherein said source emitting electromagnetic radiation is an excimer laser.

7. The apparatus according to claim 1, further comprising at least one immersion medium removal orifice.

8. The apparatus according to claim 7, further comprising a porous or fibrous material through which said immersion medium is removed.

9. The apparatus according to claim 1, wherein said porous material is kept incompletely saturated with said immersion medium.

10. The immersion lithographic system of claim 1, further including a focus air supply inlet positioned between an outer edge of an immersion medium film and an outer edge of the objective lens.

11. The immersion lithographic system of claim 1, further including a drying air supply inlet and suction outlet positioned between an outer edge of an immersion medium film and an outer edge of the objective lens assembly and a focus air supply inlet positioned between the drying air supply inlet and the outer edge of the objective lens assembly.

12. An immersion lithographic system for patterning a work piece arranged at an image plane and covered at least partly with a layer sensitive to electromagnetic radiation, comprising
   a source emitting electromagnetic radiation onto an object plane,
   a mask arranged at said object plane to relay said electromagnetic radiation toward said work piece,
   an immersion medium contacting at least a portion of an immersion optics of said lithographic system and a portion of said work piece, wherein said immersion medium is supplied through at least one orifice arranged in said immersion optics.

13. The apparatus according to claim 12, wherein said source emitting electromagnetic radiation is an excimer laser.

14. The apparatus according to claim 12, further comprising a porous or fibrous material through which said immersion medium is supplied.

15. The apparatus according to claim 14, wherein said at porous or fibrous material is kept incompletely saturated with said immersion medium.

16. The apparatus according to claim 12, further comprising at least one immersion medium removal orifice.

17. The apparatus according to claim 16, further comprising a porous or fibrous material through which said immersion medium is removed.

18. An immersion lithographic system for patterning a work piece arranged at an image plane and covered at least partly with a layer sensitive to electromagnetic radiation, comprising
   a source emitting electromagnetic radiation onto an object plane,
   a modulator, adapted to receive and modulate said electromagnetic radiation at said object plane in accordance to an input pattern description and to relay said electromagnetic radiation toward said work piece,
   an immersion medium contacting at least a portion of a objective lens of said lithographic system and a portion of said work piece, wherein an area of said contacting is restricted by capillary forces.

19. The immersion lithography system according to claim 18, further comprising a immersion medium reservoir for supplying immersion medium to said portion of said objective lens and said workpiece.

20. The immersion lithography system according to claim 19, wherein said immersion medium is supplied through a porous or fibrous material.

21. The immersion lithography system according to claim 19, wherein said immersion medium is supplied through a porous or fibrous material.

22. The immersion lithography system according to claim 18, further comprising an immersion medium reservoir for supplying immersion medium to said portion of said objective lens and said workpiece.

23. An immersion lithographic system for patterning a work piece arranged at an image plane and covered at least partly with a layer sensitive to electromagnetic radiation, comprising
   a source emitting electromagnetic radiation onto an object plane,
   a mask, adapted to receive and modulate said electromagnetic radiation at said object plane and to relay said electromagnetic radiation toward said work piece,
   an immersion medium contacting at least a portion of a final lens of said lithographic system and a portion of said work piece, wherein an area of said contacting is restricted by capillary forces.

24. A method for patterning a workpiece arranged at an image plane and covered at least partly with a layer sensitive to electromagnetic radiation, including the actions of:
   emitting electromagnetic radiation onto an object plane,
   modulating said electromagnetic radiation at said object plane in accordance to an input pattern description,
   relaying said electromagnetic radiation toward said workpiece,
   supplying an immersion medium to contact at least a portion of an objective lens of said lithographic system and at least a portion of said workpiece,
   restricting a later extension of said contact by capillary forces.

25. The method of claim 24, further including supplying focus air through an inlet positioned between an outer edge of an immersion medium film and an outer edge of the objective lens, whereby focus of the objective lens is controlled by the focus air.

26. The method of claim 24, further including supplying drying air through an inlet and removed through adjacent suction outlet positioned between an outer edge of an immersion medium film and an outer edge of the objective lens assembly and supplying focus air through an inlet positioned between the drying air inlet and the outer edge of the objective lens assembly.

27. A method for patterning a workpiece arranged at an image plane and covered at least partly with a layer sensitive to electromagnetic radiation, including the actions of:
   emitting electromagnetic radiation onto an object plane,
   modulating said electromagnetic radiation at said object plane in accordance to an input pattern description,
   relaying said electromagnetic radiation toward said workpiece,
   contacting at least a portion of an objective lens of said lithographic system and at least a portion of said workpiece via an immersion medium, wherein said contacting is restricted in a lateral direction of said workpiece by capillary forces.

28. The method according to claim 27, further including the action of:
   supplying said immersion medium via an immersion medium reservoir.

29. The method according to claim 28, wherein said immersion medium is supplied through a porous or fibrous material.

30. A method for patterning a workpiece arranged at an image plane and covered at least partly with a layer sensitive to electromagnetic radiation, including the actions of:
   emitting electromagnetic radiation onto an object plane,
   modulating said electromagnetic radiation at said object plane in accordance to an input pattern description,
   relaying said electromagnetic radiation toward said workpiece,
   forming an immersion medium film to contact at least a portion of an objective lens of said lithographic system and at least a portion of said workpiece,
   supplying immersion medium to said immersion medium film to maintain its lateral dimensions while moving said objective lens over said workpiece,
   supplying focus air through an inlet positioned between an outer edge of the medium film and an outer edge of the objective lens, whereby focus of the objective lens is controlled by the focus air.

31. The method of claim 30, further including drying air supplied through an inlet and removed through adjacent suction outlet positioned between an outer edge of the medium film and the focus air inlet.

* * * * *